(12) United States Patent
Massies et al.

(10) Patent No.: US 6,730,943 B2
(45) Date of Patent: May 4, 2004

(54) THIN SEMICONDUCTOR GAINN LAYER, METHOD FOR PREPARING SAME, LIGHT-EMITTING DIODE COMPRISING SAID LAYER AND ILLUMINATION DEVICE

(75) Inventors: Jean Claude Massies, Valbonne (FR); Nicolas Pierre Grandjean, LeCannet (FR); Benjamin Gérard Pierre Damilano, Antibes (FR)

(73) Assignee: Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 10/257,515

(22) PCT Filed: Apr. 11, 2001

(86) PCT No.: PCT/FR01/01115
§ 371 (c)(1),
(2), (4) Date: Oct. 11, 2002

(87) PCT Pub. No.: WO01/78157
PCT Pub. Date: Oct. 18, 2001

(65) Prior Publication Data
US 2003/0092209 A1 May 15, 2003

(30) Foreign Application Priority Data
Apr. 12, 2000 (FR) ............................................. 00 04683

(51) Int. Cl.[7] .............................................. H01L 33/00
(52) U.S. Cl. ........................ 257/103; 257/79; 257/89; 257/94; 257/102; 438/35; 438/46; 438/478
(58) Field of Search ........................ 257/79, 86, 87, 257/89, 90, 94, 102, 103; 438/28, 34, 35, 46, 47, 478, 492, 962

(56) References Cited

U.S. PATENT DOCUMENTS 5,851,905 A 12/1998 McIntosh et al. ........... 438/492
6,303,404 B1 * 10/2001 Moon et al. .................. 438/46

FOREIGN PATENT DOCUMENTS

JP 10022525 1/1998 ........... H01L/33/00
JP 11087773 3/1999 ........... H01L/33/00

OTHER PUBLICATIONS

Damilano et al., "From Visible to White Light Emission by GaN Quantum Dots on Si(111) Substrate", Aug. 16, 1999 American Institute of Physics, vol. 75, No. 7, pp. 962–964.
Roberts et al. "Stacked InGaN/AlGaN Double Heterostructures", 1997, Materials Research Society, vol. 449, pp. 1161–1165.

* cited by examiner

Primary Examiner—Evan Pert
Assistant Examiner—Asok Kumar Sarkar
(74) Attorney, Agent, or Firm—Thelen Reid & Priest LLP

(57) ABSTRACT

Thin, single semi conducting layer of GaInN, possibly containing a small percentage of arsenic, phosphorus or antimony, the said layer emitting at least two visible lights with determined colors which can be combined, particularly to obtain white light.

Method for preparing this layer.

Light emitting diode (LED), particularly a LED emitting white light comprising such a thin layer in its active zone, and lighting device comprising such a diode.

17 Claims, 3 Drawing Sheets

THIN SEMICONDUCTOR GAINN LAYER, METHOD FOR PREPARING SAME, LIGHT-EMITTING DIODE COMPRISING SAID LAYER AND ILLUMINATION DEVICE

STATEMENT OF RELATED APPLICATIONS

This application is a national phase of PCT/FR01/01115 which was filed on Apr. 11, 2001 and which was not published in English.

FIELD OF THE INVENTION

The invention relates to a thin, semi conducting layer of GaInN and its preparation method.

The invention also deals with a light emitting diode (LED), and particularly a light emitting diode emitting white light, comprising such a thin layer in its active zone and finally a lighting device comprising such a diode.

BACKGROUND OF THE INVENTION

The technical field of the invention may be defined as being the generation of white light. The white light satisfies the criteria set down by the IEC in 1964.

A large amount of research is now being carried out on the generation of white light in order to develop devices particularly with low cost, little energy consumption, long life and good energy efficiency.

White light has been generated for many years essentially using incandescent lamps which have a very low efficiency and short life since the efficiency is close to 5% and the life is about 1000 hours. Fluorescent tubes have a better efficiency and a longer life, with an efficiency of about 25% and a life of about 1000 hours for fluorescent lamps, but they have a number of disadvantages; they are vacuum tubes and are difficult and expensive to manufacture, and also contain several milligrams of highly toxic mercury, and therefore their destruction at the end of their life causes a serious environmental problem.

Furthermore, fluorescent tubes produce light that is not pleasant, and this often limits their use.

In terms of efficiency, the best existing industrial lamps are low pressure sodium lamps which have an efficiency of the order of 35%. In the same way as for fluorescent tubes, these lamps are not pleasant, or may even be unacceptable for standard lighting, due to their colour. Therefore, research was carried out on other devices that are safe, reliable, robust and have a long life that can produce white light at low cost with an energy efficiency greater than or equal to the energy efficiency of the devices mentioned above.

For example, these and other sources of white light, including phosphors, light emitting polymers and semiconductors, have been envisaged.

Light emitting polymers such as PPV are very inexpensive and the technology for their use that consists of simply inserting the polymer between semi-transparent electrodes, is very simple. The entire range of visible colors can be obtained and white is emitted either by a combination of colors or by the use of a single compound with a fairly wide spectrum. However, these compounds are not used at the moment except to illuminate liquid crystal screens with orange light. The short life of green and blue emitters of this type makes it impossible to use light emitting polymers to generate white light.

The generation of white light by semiconductors is based essentially on nitrides, and particularly nitrides of group m elements which alone emit green or blue with very high efficiency and long life. The most frequently used nitride type compound is GaInN which emits blue to red light.

Thus a thin layer of nitrides, for example GaInN, inserted in a material such as Ga(Al)N and for which the prohibited band fixes the emission wave length and therefore the colour, forms the elementary building block of the active zone of extra bright light emitting diodes (LEDs).

The GaInN layer is usually less than or equal to 100 Å thick and in this case we frequently refer to GaInN/Ga(Al)N quantum well LEDs, which have an emission centred on a particular colour, for example blue or green.

It is frequently accepted that the indium composition and/or the thickness of the GaInN layer fixes the transition energy of the quantum well, and consequently the emission wave length of the LED. However, for indium compositions greater than 10%, GaInN/Ga(Al)N quantum wells have optical properties that are very specific, including an abnormally long radiation life of the excitons and the very small variation of the energy of the prohibited band as a function of the pressure.

Bright blue LEDs, which already have a very high efficiency (more than 10%) are used for the generation of white light using a hybrid technology in which the blue LED is used to pump phosphorus or polymers. A combination of the yellow light from these compounds with the light from the LED produces white light by the combination of colors. This technology is currently widely used both by NICHIA® and by HEWLETT-PACKARD®, GELCORE® or SIEMENS-OSRAM®, and its application to domestic lighting is quite promising.

However, coupling a LED and another constituent such as phosphor or polymer in order to obtain white light, due to its hybrid nature, is an expensive and complex process including several technological steps, for example involving a subsequent deposit of a phosphor or polymer type compound before encapsulation, on a blue LED.

It is not easy to balance colors with a hybrid LED-polymer/phosphorus device, and it is not easy to obtain a white qualified as being "pleasant" for domestic lighting. Furthermore, like the method for its preparation, the device is complex and comprises a large number of elements and is therefore not as reliable as the basic nitride LED that has an intrinsic life of about 100 000 hours.

Finally, the inherent efficiency of a hybrid system in which losses are inevitable is less than the efficiency of a pump nitride LED.

Therefore, it would be interesting to be able to use light emitting diodes (LEDs) that emit white light directly, to overcome the disadvantages of hybrid devices involving coupling of a blue (or green) LED with a phosphor or polymer.

The article by B. DAMILANO, N. GRANDJEAN, F. SEMOND, J. MASSIES and M. LEROUX, Appl. Phys. Lett. 75, 962 (1999) recently showed that it is possible to produce white light under optical excitation by means of a laser, in a monolithic structure based on semiconductors consisting of nitrides of elements in group III in the periodic classification. It uses a stack of four planes of GaN quantum boxes separated by AlN layers. The size of the quantum boxes fixes the emission wave length and therefore it is sufficient to adjust the wave length in each plane such that the resulting emission from the four planes is white by the simple principle of combining colors. Unfortunately, this structure cannot be used as an active zone in a light emitting diode (LED) type optoelectronic device for the simple reason that the AlN material cannot have a p type doping.

Furthermore, electric injection is difficult to control in this type of structure and it may cause a colour balancing problem which eventually makes it difficult to generate white.

Therefore, there is a need for a semi conducting layer that emits white light (or any other light resulting from the combination of several colors, and particularly primary colors) directly and that can be inserted directly as an active zone in a LED, like the GaInN/Ga(Al)N quantum wells now used for these blue and green commercial LEDs; this single layer may be manufactured easily at low cost using a safe, reliable, and tested method with a limited number of steps.

One of the purposes of this invention is to satisfy these needs.

BRIEF DESCRIPTION OF THE INVENTION

This purpose and other purposes are achieved according to this invention by a single, thin, semi conducting layer of GaInN that emits at least two visible lights with determined colors which can be added particularly to obtain white light.

A GaInN layer means a layer of GaInN, or GaInN that may, for example, contain a small percentage of arsenic, phosphorus or antimony.

A small percentage usually means a percentage less than 5%.

More precisely, the thin layer according to the invention is formed by putting at least two deposits of GaInN (with the same composition or a different composition), each of which emits visible light with a determined colour, adjacent to each other or superposed with each other.

Advantageously, the combination of said at least two visible lights with determined colors produces white light.

A completely unexpected result of the invention is that several lights with determined colors are emitted from a single thin layer of GaInN. In the past, from a single thin layer of GaInN it was only possible to obtain a single clearly defined colour of light, for example blue, green or yellow, as is the case in blue or green quantum wells currently used in LEDs.

According to the invention, several emissions of light of different determined colors are no longer obtained from several clearly delimited layers of GaIn(Al)N separated by barriers, for example of Ga(Al)N, but are now obtained from a single thin layer of GaInN.

Therefore the layer in this invention is fundamentally different from the complex structure described in the DAMILANO et al document mentioned above. In this document, four different separate independent and isolated layers are used that emit at different wave lengths that are combined to form white light, whereas according to the invention, on the contrary there is only one layer that, for example, emits four different wave lengths.

If this type of structure made for the GaN system was transposed to the GaInN/Ga(Al)N system, by placing at least two layers of GaInN separated by a Ga(Al)N barrier in a Ga(Al)N p-n junction, their emission would be centred, for example one on the yellow and the other on the blue, and the resulting global emission would be white according to the criteria set down by the EEC in 1964. However, in the structure type, it is not easy to check electronic injection into the different layers of GaInN, which causes a colour balancing problem and makes it difficult to generate white light.

The approach adopted according to the invention is fundamentally different, since a single thin semi conducting layer based on a GaInN alloy emits several colors and no longer a single colour, and the combination of several colors preferably gives white light. It is worth mentioning in passing that it is possible to continuously emit anywhere in the visible spectrum, starting from the thin single layer according to the invention. Although preferably this visible light with different determined colors is combined to produce white light, any light with a colour derived from the combination of two or more determined colors of light may be obtained by the layer according to the invention. These different determined colors of light are preferably the so called primary colors (blue, green or red).

For example, white can be obtained from three deposits which emit blue, green and red light respectively, and white can also be obtained from two deposits only which emit blue and yellow light respectively.

In a completely unexpected manner, and which is contrary to everything that was accepted in the past, the inventors have carried out experiments in photoluminescence on samples made in the laboratory by Molecular Jet Epitaxy (EJM), and have shown that GaInN/GaN heterostructures do not have the expected quantum well behaviour. More precisely, the inventors have surprisingly demonstrated that the emission of photons in the GaInN alloy originates from extremely localised carriers, for which the extension of the associated wave function is of the order of a few atomic meshes. This invention is largely based on experimental demonstration of the very strong concentration of carriers in the GaInN alloy, since it makes it possible to put several GaInN deposits with a thickness of a few nanometers adjacent to each other, without any coupling of wave functions which would lead to a single energy level.

If a thin layer of a semi conducting material A with thickness Lw is considered, inserted in a material B with a wider prohibited band, the energy E(Lw) of the quantum well B/A/B is fixed by Lw. If two deposits of material A with widths $Lw_1$ and $Lw_2$ are formed, the energy of the quantum well B/A/A/B is unique and depends only on $Lw_1+Lw_2$. If a very thin barrier of material B with width Lb is inserted between two deposits of material A, we will then have a system with coupled quantum wells B/A/B/A/B, for which the basic level depends on $Lw_1$, $Lw_2$ and Lb. In traditional semiconductors of the arsenide type (such as GaAs), the wave functions associated with the carriers (electron and hole) have lateral extensions of several tens of Angstroms. Thus, the barrier Lb must be greater than 100 Å to decouple the two wells and observe the emission from each of them. According to the invention, it has been observed that the wave function of carriers in GaInN based quantum wells is so localised that there is no longer any coupling between the wells, even for very thin barriers for example less than one nanometer, which is unexpected. Putting two deposits of GaInN adjacent to each other, in other words without any intermediate growth of a Ga(Al)N barrier, with different thicknesses corresponding to different transition energies, will result in the two distinct transitions. Therefore according to the invention, it is possible to make a thin layer of GaInN for which the thickness is less than or equal to 100 Å, with maximum emissions at different wave lengths, without coupling.

Thus, GaInN/GaN heterostructures have been made in epitaxy by EJM, and by organo-metallic vapour phase epitaxy (EPVOM), that emit throughout the visible range from blue (0.4 μm) to red (0.66 μm), at ambient temperature.

The invention also relates to a method for the preparation of a thin single semi conducting layer of GaInN, possibly containing a small percentage of arsenic, phosphorus or antimony, said layer emitting at least two determined colors of visible light, in which said layer is deposited in distinct time steps, by making successive GaInN deposits (with the same composition or different compositions), the growth being interrupted between each deposit, each of said deposits emitting visible light with a determined colour.

Advantageously, the combination of said at least two determined colors of visible light produces white light.

Advantageously, the colour of the light emitted by each of the deposits is fixed by varying the temperature and/or the duration of the growth of the deposit and/or other parameters that may govern the growth of the deposit, and/or the temperature while the growth is interrupted, and/or the duration of said interruption.

According to the invention, the single layer of GaInN is deposited sequentially rather than continuously, with an interruption of growth between each deposit. In other words, the deposit of GaInN is fractioned and growth must be interrupted such that each deposit emits a determined colour of light after depositing an ad hoc quantity of GaInN.

Furthermore and completely surprisingly, it has been demonstrated that according to the invention, the thickness of GaInN is not the direct factor that determines the transition energy and therefore the colour of light emitted from a GaInN/GaN heterostructure, which is contrary to what is known for conventional III–V semiconductors for example such as GaAs/AlGaAs or GaInAs/GaAs, but amazingly the temperature and/or the duration of the growth of the deposit and/or the temperature while growth is interrupted and/or the duration of said interruption.

In relation to what has already been described above, the inventors have carried out a series of experiments in the laboratory to prove that the size of objects responsible for luminescence in GaInN is a few nanometers, or even less than a nanometer.

These objects are formed during the growth of GaInN and their size and consequently their energy depend on the deposit time and/or growth conditions.

Preferably, the colour of light emitted by each deposit is fixed by varying the duration and/or temperature of the growth of each deposit.

It is possible to increase the temperature when growth is interrupted between each deposit. Furthermore, the objects mentioned above such as clusters of InN, In—In pairs that are formed during growth and that cause a very strong concentration of carriers, and consequently a complete lack of coupling, are intrinsic and do not depend on the deposition and growth techniques used. In other words, the unexpected properties of the layers described here are intrinsically related to the GaInN alloy and do not depend on the deposition technique used. Therefore, any technique known to those skilled in the art may be used; this is an extremely important advantage of this invention.

Therefore, deposits may be made by Molecular Jet Epitaxy (EJM), and also by Organometallic Vapour Phase Epitaxy (EPVOM).

It is extremely interesting that according to the invention, the EPVOM technique can be used since this is the technique most frequently used nowadays for the manufacture of blue, green and white nitride LEDs.

Thus, another purpose of the invention is a light emitting diode comprising at least one thin layer in its active layer according to the invention, as described above.

Preferably, the said thin layer and therefore the diode emit white light.

Finally, the invention deals with a lighting device, preferably generating white light, comprising the said diode.

Thus, all disadvantages related to devices for the production of white light according to prior art may be overcome and white light can be produced at low cost, with low energy consumption, with a very long life (for example 100 000 hours), a very low voltage and without any toxicity.

White light is produced according to the invention directly by electroluminescence, by a single element and therefore monolithically (without a "converter"), without needing complex and therefore expensive hybrid techniques based on the coupling of a blue LED and another phosphorus or polymer constituent. The efficiency of a monolithic system according to the invention is obviously better than the efficiency of a hybrid system in which losses are inevitable.

In the same way as for GaInN/Ga(Al)N quantum wells currently used in commercial green and blue LEDs, the thin layer according to the invention may easily be inserted directly into a LED as an active zone.

This invention reduces the cost of white LEDs since it is no longer necessary to use a phosphorus or a polymer in addition to a nitride blue LED for the production of white. This eliminates a number of technological steps made necessary by deposition of phosphorus/polymer on the LEDs before encapsulation, and therefore simplifies the manufacturing method. Other steps in the process remain the same and therefore require no modification since the invention only concerns the active zone of the LEDs.

Therefore LEDs and light production devices according to the invention are reliable, simple, solid and have a long life, are inexpensive, protect the environment, are easy to make and produce a pleasant light. During this process, it is easy to balance colors in order to obtain a "pleasant" white for domestic lighting or with a dominant colour on request. Furthermore, the device is so simple that its reliability must be improved. A nitride LED has an estimated life of about 100 000 hours.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of an internet browser. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

Production of a thin layer of GaInN emitting white light requires an initial calibration of the wave length of the heterostructure comprising a layer of GaInN and barrier layers, preferably of Ga(Al)N, as a function of growth conditions for the GaInN alloy. It is necessary to cover a large part of the visible spectrum, at least from blue to yellow, so that colors can be added to obtain white, for example by the combination of blue and yellow light.

Once the calibration has been made, the different deposits of GaInN corresponding to the required colors are made using the method according to the invention, in order to obtain different deposits of GaInN with the same composition or different compositions, by superposition or putting one adjacent to the other, to obtain a single, thin layer emitting a colour resulting from the addition of different determined colors emitted by each deposit.

In a LED type device, the thin layer according to the invention is usually deposited on a barrier layer forming a substrate, which may for example be a layer of Ga(Al)N, usually of the n type. The heterostructure is terminated by a barrier layer, this terminal layer for example being a layer of Ga(Al)N, usually of the p type.

In the embodiment described, in order to obtain emission of white light from a single thin layer of GaInN according to the invention, this layer is deposited sequentially and at different times, rather than continuously, with growth being interrupted after each deposition of GaInN.

Figure 1:
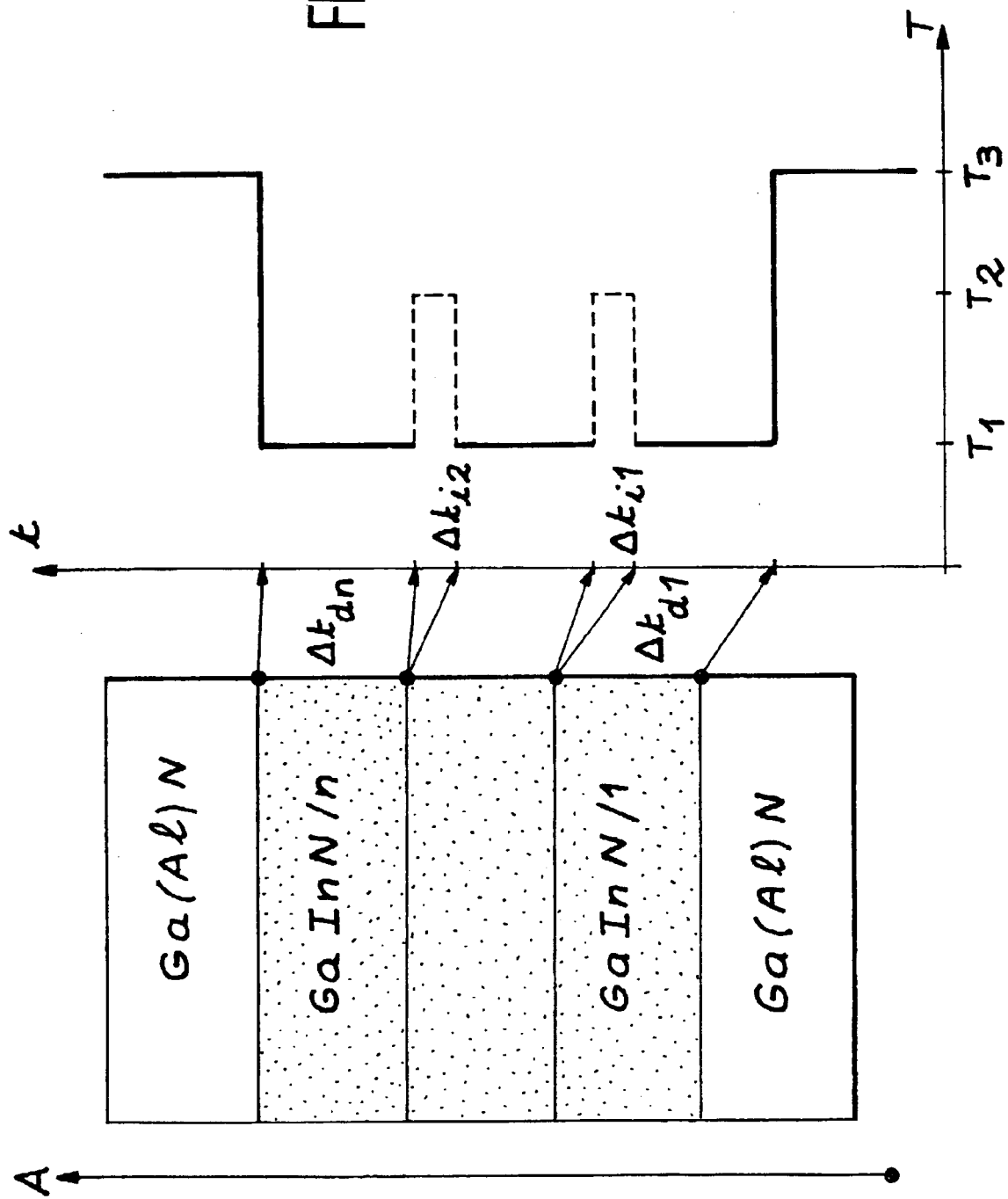
FIG. 1 is a diagram illustrating the preparation of a heterostructure comprising Ga(Al)N barrier layers, between which a thin layer according to the invention is placed, using the method according to the invention. The left part of the graph with a growth axis (A) illustrates the growth of layers and deposits as a function of time (t); the right part of the graph shows the growth temperatures (T) used during time, during growth of the different layers and deposits, and during interruptions of the growth (parts in dashed lines).

The method used is described diagrammatically in FIG. 1. This figure shows the temperatures $T_1$, $T_2$ and $T_3$ where $T_1$ is the temperature used for the n deposits of GaInN (GaInN/ 1, GaInN/2, . . . , GaInN/N), $T_2$ is the increase in temperature or annealing (if any) during interruption of growth, and $T_3$ is the temperature of the deposition of substrate and terminal barrier layers, preferably made of Ga(Al)N.

The temperature $T_1$ is usually between 500° and 800° C.
The temperature $T_2$ is usually between 500° and 800° C.
The temperature $T_3$ is usually between 750° and 1050° C.

In this embodiment, the colour of light emitted by each deposit is fixed by the duration of the deposit, and other growth parameters such as the temperature remain constant, as mentioned above. Thus, the durations of the sequential deposits of GaInN correspond to $\Delta td_1$, $\Delta td_2$, . . . $\Delta td_n$, for example, the durations of the deposits are from 2 to 8 minutes. The light emitted for each deposit duration has a determined colour. After each deposit, the growth is interrupted for a duration of $\Delta ti_1$, $\Delta ti_2$, . . . . This interruption in growth may be, but is not necessarily, accompanied by an increase in temperature or annealing ($T_2$), for example up to 100° or 200° C. above $T_1$, depending on growth conditions.

Once all deposits forming the thin layer according to the invention have been made, each deposit corresponding to one colour and the combination of all colors preferably producing white light, the terminal layer is deposited; this terminal layer is usually a p type Ga(Al)N.

The invention will now be described with reference to the following examples, given for illustrative purposes that are in no way restrictive.

EXAMPLE 1

Figure 2:
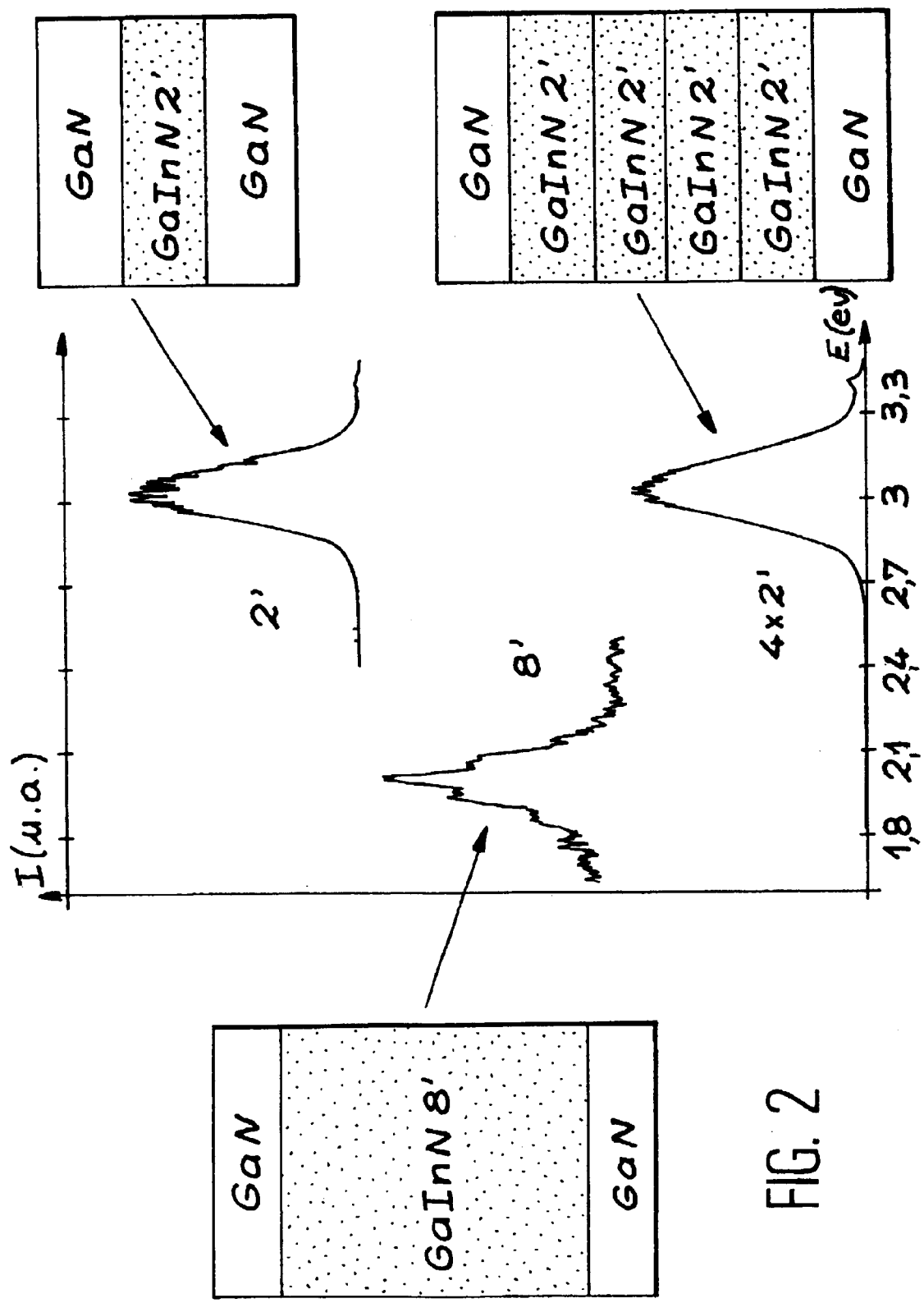
FIGS. 2 and 3 are graphs that show the photoluminescence intensity (I in arbitrary units), as a function of the photoluminescence energy (E in eV) at ambient temperature, for various layers of GaInN prepared by doing the deposition in several time steps or in a single time step, and varying the duration of the deposit(s) (8, 2, 6, 3minutes).

A thin layer of GaInN is deposited by Molecular Jet Epitaxy (EJM) on a GaN substrate layer previously deposited on an ad hoc substrate which may therefore be GaN itself or sapphire, silicon or silicon carbide, under the following growth conditions: the layer is deposited continuously in a single step with a deposition duration of two minutes ($\Delta t_{d1}=2'$, n=1), without making the deposit at different time steps. The terminal layer is also GaN. The result is thus a heterostructure emitting in the violet (see FIG. 2, curve at top right).

EXAMPLE 2

A thin layer of GaInN is deposited by EJM under the same conditions as for example 1, except that the layer is deposited continuously in a single step with a deposit duration of 8 minutes ($\Delta td_1=8'$, n=1). The result is thus a heterostructure emitting in the red (see FIG. 2, curve at middle left).

EXAMPLE 3

A thin layer of GaInN is deposited by EJM under the same conditions as in example 2, the total deposition time being eight minutes, but the deposition time of GaInN is broken down into four successive depositions with a deposition duration of two minutes for each deposit ($\Delta td\mathbf{1}=\Delta td\mathbf{2}=\Delta td\mathbf{3}=\Delta td\mathbf{4}=2'$, n=4), with growth being interrupted between each deposit (duration 1 minute) and an increase in temperature equal to 100–200° C. above the growth temperature. The result is thus a heterostructure once again emitting in the violet, namely the energy corresponding to two minutes once only (see FIG. 2, curve at bottom right).

EXAMPLE 4

A thin layer of GaInN is deposited by EJM under the same conditions as in example 1, but the layer is deposited continuously in a single step with a deposition duration of three minutes ($\Delta td_1=3'$, n=1).

Figure 3:
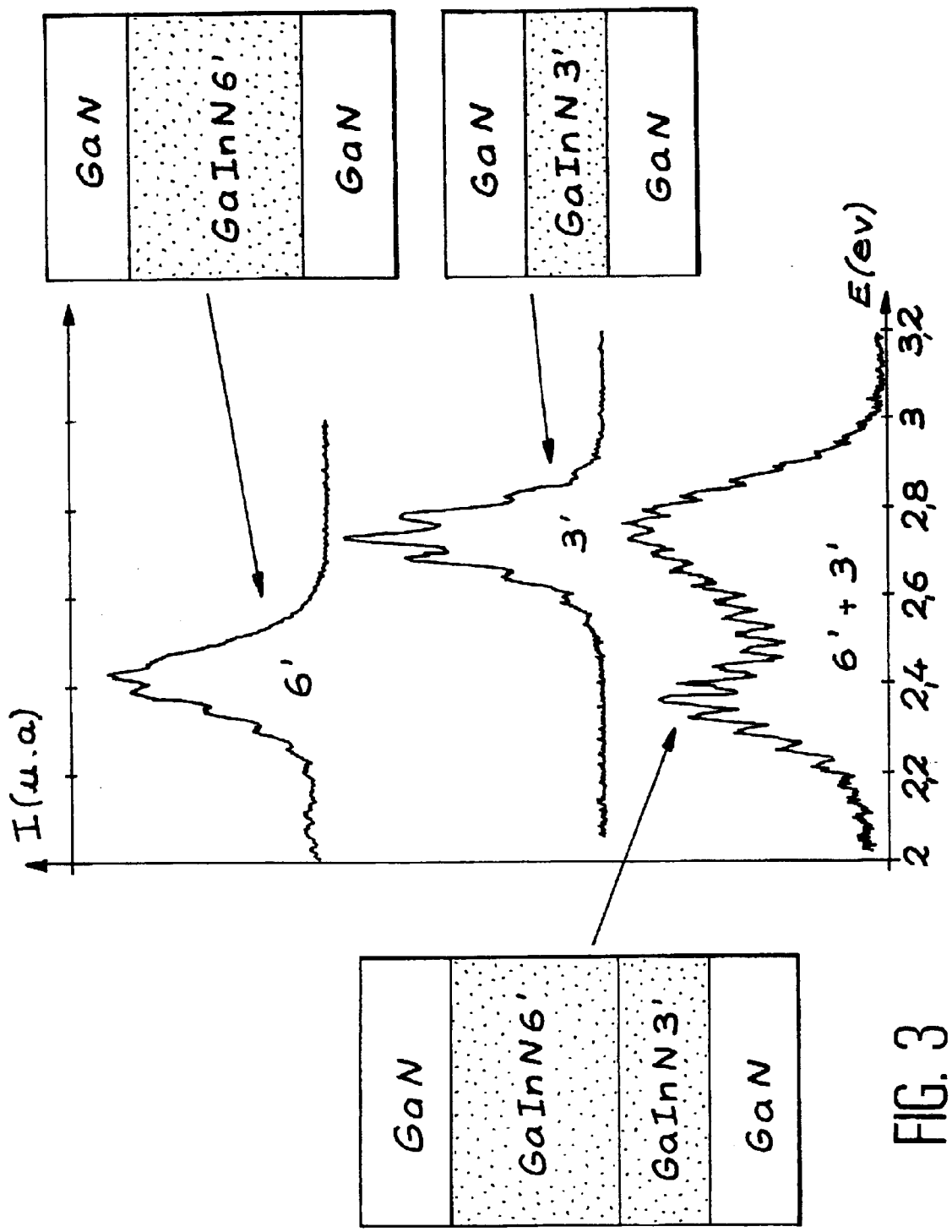

The result is thus a heterostructure emitting in the blue (see FIG. 3, middle curve).

EXAMPLE 5

A thin layer of GaInN is deposited by EJM under the same conditions as in example 1, except that the layer is deposited continuously in a single step with a deposition duration of six minutes ($\Delta td_1=6'$, n=1). The result is thus a heterostructure emitting in the yellow—green (see FIG. 3, top curve).

EXAMPLE 6

A thin layer of GaInN according to the invention is deposited by EJM under the same conditions as in examples 4 and 5, but the deposition time is broken down into steps. By making a deposition broken down into steps at different times, a first deposit of GaInN is made for a duration of three minutes ($\Delta td_1=3'$) with the same growth conditions as in example 4, followed by a second deposit of GaInN with the same nominal composition as the first deposit for a duration of six minutes ($\Delta td_2=6'$, n=2), as in example 5. The other growth conditions remain the same during the first and second deposits, and there is a short interruption in growth between the two deposits (for a duration of about 1 minute) with a temperature increase from 100° to 200° C. above the growth temperature. FIG. 3 (bottom curve) shows that the photoluminescence spectrum corresponding to this sample actually includes the emission of each deposit of GaInN taken separately, although a single layer is obtained.

Without optimisation, the combination of the two emission peaks of each deposit produces light emission close to the white. This example and FIG. 3 show that by breaking the deposition time of GaInN alloy into different time steps, it is possible to obtain an emission of white light from a single thin layer of GaInN, according to the invention; each growth time of GaInN corresponds to a specific colour, and the combination of colors produces white light. It would have been possible to obtain the same result by combining three colors such as blue, green and red instead of two. Similarly, it has been demonstrated that similar results are obtained by EPVOM.

What is claimed is:

1. A thin layer comprising:
    a single, thin, semi conducting layer of GaInN; and
    a small percentage of arsenic, phosphorus or antimony,
    wherein the layer emits at least two visible lights with determined colors.

2. The thin layer according to claim 1, further comprising at least two deposits of GaInN adjacent to each other or superposing them, each deposit emitting a visible light with a determined colour.

3. The thin layer according to claim 2, in which there are three of said deposits and they emit blue, green and red light respectively.

4. The thin layer according to claim 2, in which there are two of said deposits and they emit blue and yellow light respectively.

5. The thin layer according to claim 1, in which the combination of said visible lights with at least two determined colors produces white light.

6. The thin layer according to claim 1, wherein the thickness of which is less than or equal to 100 Å.

7. A light emitting diode (LED) comprising at least one thin layer in its active zone, according to claim 1.

8. The light emitting diode according to claim 7, emitting white light.

9. A lighting device comprising at least one light emitting diode according to claim 7.

10. A lighting device emitting white light, comprising at least one light emitting diode according to claim 8.

11. A method for preparing of a single, thin, semi conducting layer of GaInN comprising:
    successively growing deposits of GaInN with the same composition, an interruption in the growth being allowed between each deposit, each of said deposits emitting a visible light with a determined colour, wherein the layer of GaInN comprises these deposits and a small percentage of arsenic, phosphorus or antimony, said layer emitting visible lights with at least two determined colors.

12. The method according to claim 11, in which the combination of said visible lights with at least two determined colors produces white light.

13. The method according to claim 11 further comprising, varying the temperature and/or the growth duration of the deposit and/or the other parameters governing growth of the deposit, if any, and/or the temperature during the interruption of growth, and/or the duration of said interruption to fix the colour of the light emitted by each deposit.

14. The method according to claim 13 further comprising, varying the duration and/or temperature of growth of each deposit to fix the colour of light emitted by each deposit.

15. The method according to claim 11 further comprising, further increasing the temperature while interrupting the growth.

16. The method according to claim 11, in which the deposits are made by Molecular Jet Epitaxy (EJM).

17. The method according to claim 11, in which the deposits are made by Organo-Metallic Vapour Phase Epitaxy (EPVOM).

* * * * *